(12) United States Patent
Lastrucci

(10) Patent No.: US 6,281,767 B1
(45) Date of Patent: Aug. 28, 2001

(54) RECONSTRUCTION FILTER FOR ELIMINATING THE SWITCHING RESIDUE IN A SWITCHED SYSTEM

(76) Inventor: Claudio Lastrucci, Via Carcheri 327 - Vigliano, 50055 Lastra a Signa, Firenze (IT)

(*) Notice: Subject to any disclaimer, the term of this patent is extended or adjusted under 35 U.S.C. 154(b) by 0 days.

(21) Appl. No.: 09/367,708

(22) PCT Filed: Feb. 19, 1998

(86) PCT No.: PCT/IT98/00031

§ 371 Date: Aug. 17, 1999

§ 102(e) Date: Aug. 17, 1999

(87) PCT Pub. No.: WO98/37628

PCT Pub. Date: Aug. 27, 1998

(30) Foreign Application Priority Data

Feb. 21, 1997 (IT) .................................................. FI97A0027

(51) Int. Cl.⁷ ..................................................... H03H 7/09
(52) U.S. Cl. ..................... 333/167; 333/177; 330/207 A; 330/251
(58) Field of Search .................................. 330/10, 207 A, 330/251; 333/167, 177

(56) References Cited

U.S. PATENT DOCUMENTS

| 4,628,275 | 12/1986 | Skipper et al. ......................... 330/10 |
| 5,113,145 | * 5/1992 | Ideler et al. .................. 330/207 A X |

FOREIGN PATENT DOCUMENTS

| 195 12 754 A1 | 10/1996 | (DE) . |
| 2020505 | * 11/1979 | (GB) .................................... 330/251 |
| 55-082516 | 6/1980 | (JP) . |

* cited by examiner

*Primary Examiner*—Justin P. Bettendorf
(74) *Attorney, Agent, or Firm*—McGlew and Tuttle, P.C.

(57) ABSTRACT

The filter for eliminating a carrier signal from a modulating signal generated by a circuit supplying a load (Z) comprises a filtering circuit (L, C; L', C') and a cancellation network (Lx, Cx, V₂; Lx, Cx, Lx', Cx') which, when the load is connected to said filter, subtracts from the load a current equal to the residual carrier signal passing through said filtering circuit (L, C; L', C').

20 Claims, 3 Drawing Sheets

(STATE OF THE ART)

(STATE OF THE ART)

RECONSTRUCTION FILTER FOR ELIMINATING THE SWITCHING RESIDUE IN A SWITCHED SYSTEM

FIELD OF THE INVENTION

The present invention relates to an output filter for eliminating the switching residue of a carrier signal from a modulating signal, for example in order to eliminate the switching residue from the signal supplied by a generator, for example a PWM generator, to a load connected to said system.

BACKGROUND OF THE INVENTION

In particular, in the sector of the audio band amplifiers there are currently used, in addition to linear amplifiers, switching devices which can be schematically described as a pair of switches controlled at a high switching frequency which switch the current to the load in an alternating way. The timing of the switching instants follows a modulation criterion according to the signal to be reproduced. The output signal, consisting of the sum of the carrier signal and the modulating signal, is demodulated in a low-pass filter which extracts the low-frequency modulating signal from the high-frequency carrier. A diagram of an amplifier and of a corresponding low-pass filter of this type which are currently known is provided in FIG. 1. The numbers 1 and 3 indicate two electronic switches controlled by a PWM circuit indicated in a general way by 5. The chopped signal at the output is sent to a low-pass filter formed by a single L-C network comprising an inductance L and a capacitance C. The L-C network has a cut-off frequency of the order of 25 kHz to eliminate the high-frequency switching signal from the signal sent to the load Z, so that a signal containing only the frequencies in the audio range is supplied to the load (for example a loudspeaker).

With this system, attenuations of 12 dB/octave are obtained. To obtain greater attenuations, it is possible to dispose two or more L-C networks in cascade connection, with a consequent increase of the output impedance of the amplifier.

The system may also be of the balanced type, in other words with a bridge configuration of the type illustrated in FIG. 2, where the load Z is disposed between two pairs of controlled switches 1, 3 and 1', 3'. The control signals of the two pairs of switches 1, 3 and 1', 3' are equal but in opposite phase. The symbol L, C and L', C' indicate the components of the low-pass output filters.

By comparison with amplifiers of the linear type, switching amplifiers have the advantage of a higher theoretical efficiency, equal to 100%, since there are only two possible conditions of the switches, namely: closed switch, zero voltage, non-zero current, zero power dissipation; and open switch, non-zero voltage, zero current, zero power dissipation.

At the present time, however, this technology has considerable problems, particularly for application to the audio sector, arising from the limits of the output reconstruction filter which, in order to attenuate the switching residue, also has drastic effects in the pass band, with natural resonances, distortion, and an increase in output impedance at high frequencies beyond the acceptable limits. The limits imposed by the output reconstruction filter are principally as follows:

a) increase of the output impedance of the filter as a function of the number of networks and the decrease of the cut-off frequency of each network;

b) high variation of the frequency and phase response characteristics as a function of the load impedance;

c) insufficient attenuation of the switching residue in cases in which the ratio between the pass band and the switching frequency is high. This problem arises whenever a compromise between quality and switching losses is sought;

d) increase of the phase rotation of the output signal in proportion of the number of L-C networks used;

e) increase of the resistive part of the filter with an increase in the number of L-C networks which leads to an increase in the conduction losses in the filter and consequently a loss of efficiency;

f) increase of the volume and total cost of the filter with an increase in the number of L-C networks for a given switching frequency;

g) resonances in the pass band which are dangerous for the operation of the amplifier in no-load conditions.

SUMMARY OF THE INVENTION

The purpose of the present invention is to provide an output filter for a switching system of the type mentioned above which overcomes the disadvantages of conventional filters.

The solution proposed by the invention consists in configuring the output filter on the basis of an L-C network, with attenuation and phase characteristics in the pass band that are acceptable in terms of quality, and adding to this a dipole or cancellation network which provides a very high attenuation at the switching frequency and a minimum effect in the pass band. In practice, the dipole generates a signal equal and opposite to the switching residue at the terminals of the load, in such a way that the sum of the two signals is canceled and no current at the switching frequency flows to the load.

The resonant frequency of the L-C network is lower than the switching frequency, so that it presents an inductive behavior to the generator.

Further advantageous characteristics of the device according to the invention are indicated in the attached claims and will be described in greater detail with reference to some diagrams showing examples of embodiments. The invention will be more clearly understood from the description and the attached drawing, which shows non-restrictive practical examples of the invention.

DESCRIPTION OF THE PREFERRED EMBODIMENT

Figure 1:
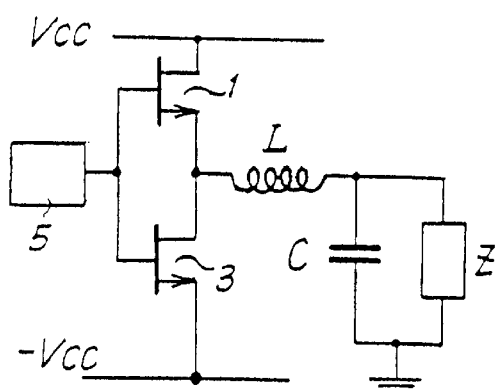
FIGS. 1 and 2 show two configurations according to the known art as described above.

With reference to FIG. 1, the concept on which the present invention will initially be illustrated in a particularly simple configuration. The symbol Z indicates in a general way the load to be supplied and L and C again indicate, as in FIG.

1, the inductance and capacitance of the L-C network of the filter. The symbol V1 indicates schematically the signal source, which contains both the modulated signal and the switching signal. The number 11 indicates in a general way the cancellation dipole connected in parallel to the load Z. It comprises a generator V2 and an impedance X, consisting of an inductance Lx and a capacitance Cx in series. Additionally, in the diagram in FIG. 3, the symbols $I_1, I_2$ and $I_3$ indicate, respectively, the current flowing in the inductance L, the current flowing in the inductance Lx and the current in the load Z. The reconstruction filter performs its function correctly if:

$I_2 = -I_1$ at the switching frequency $w_c$ $I_2$ approximately 0 in the pass band.

If $I_2 = V_2/X = -I_1$ then the system will have zero voltage across the terminals of the load Z at the switching frequency, with zero current flowing through the load. The correct operation of the filter implies that the value of X is equal to the nominal value $V_2/I_2$ at the switching frequency $w_c$ and at the highest possible value (tending towards infinity) in the pass band, in order that the cancellation dipole interferes to the least possible extent with the characteristics determined by the L-C network. In the configuration in FIG. 3, $I_3 = I_1 + I_2 = 0; I_{1=-I2}$ $I_1 = V_1/jwL$ and $I_2 = V_2 j w Cx/(1 - w^2 Lx Cx)$ given the condition $V_2 = -V_1,$ in other words that the two generators are equal and in antiphase, then $V_1/jwL = V_1 jwCx/(1 - w^2 Lx Cx)$ and therefore $1 - w^2 Lx Cx = -w^2 L Cx$ from which it is easy to deduce the relationship between the switching frequency w and the values Lx, Cx, and L:

$w = 1/((Lx - L)Cx)^{1/2}$

This procedure is formally valid only if the generators $V_1$ and $V_2$ are sinusoidal and are mirror images of each other, in other words are in antiphase.

As regards the nature of the generators, it is found that the condition of being sinusoidal is not a necessary condition for the final result, since the filter has excellent attenuation, even beyond the switching frequency, of the square wave whose harmonic composition varies as a function of the modulation index.

Figure 7:
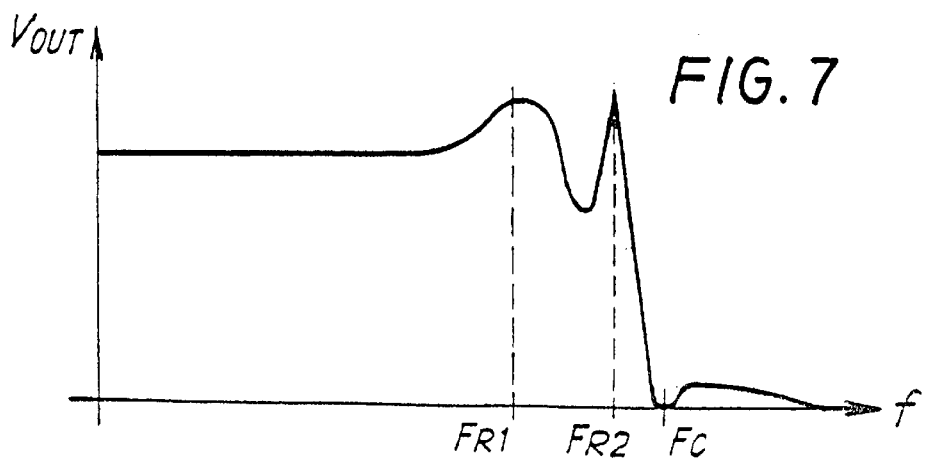
FIG. 7 is a diagram provided for guidance, reproducing a possible response profile of the filter according to the invention.

It may be found that multiple alignments of the output filter are possible, since it is possible to keep $w_c$ and L at fixed values and to vary Lx and Cx in such a way as to reach the optimal alignment, in other words the characteristic of attenuation at the harmonics above the switching frequency. FIG. 7 shows an example of the response of the filter: the horizontal axis shows the frequencies and the vertical axis shows the output voltage. The cancellation frequency is indicated by Fc.

Figure 2:
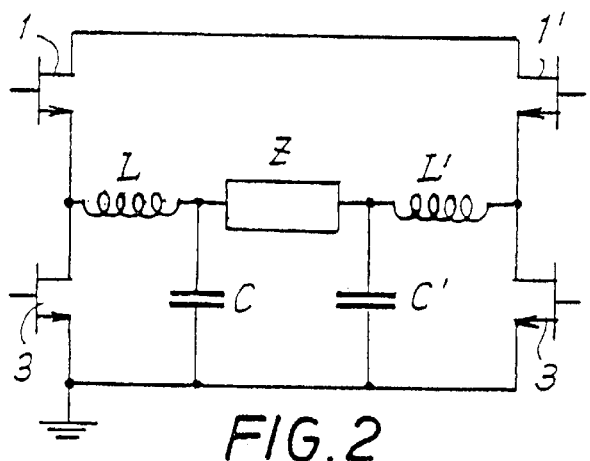
Figure 5:
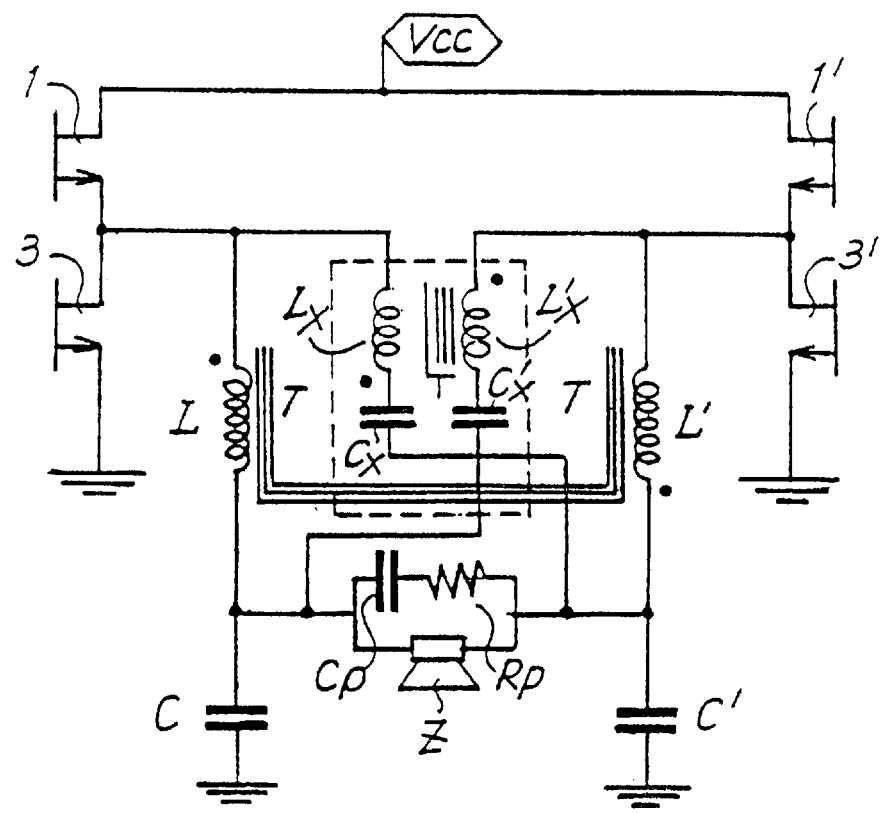
FIGS. 5 and 6 show successive improvements of the system shown in FIG. 4.
Figure 6:
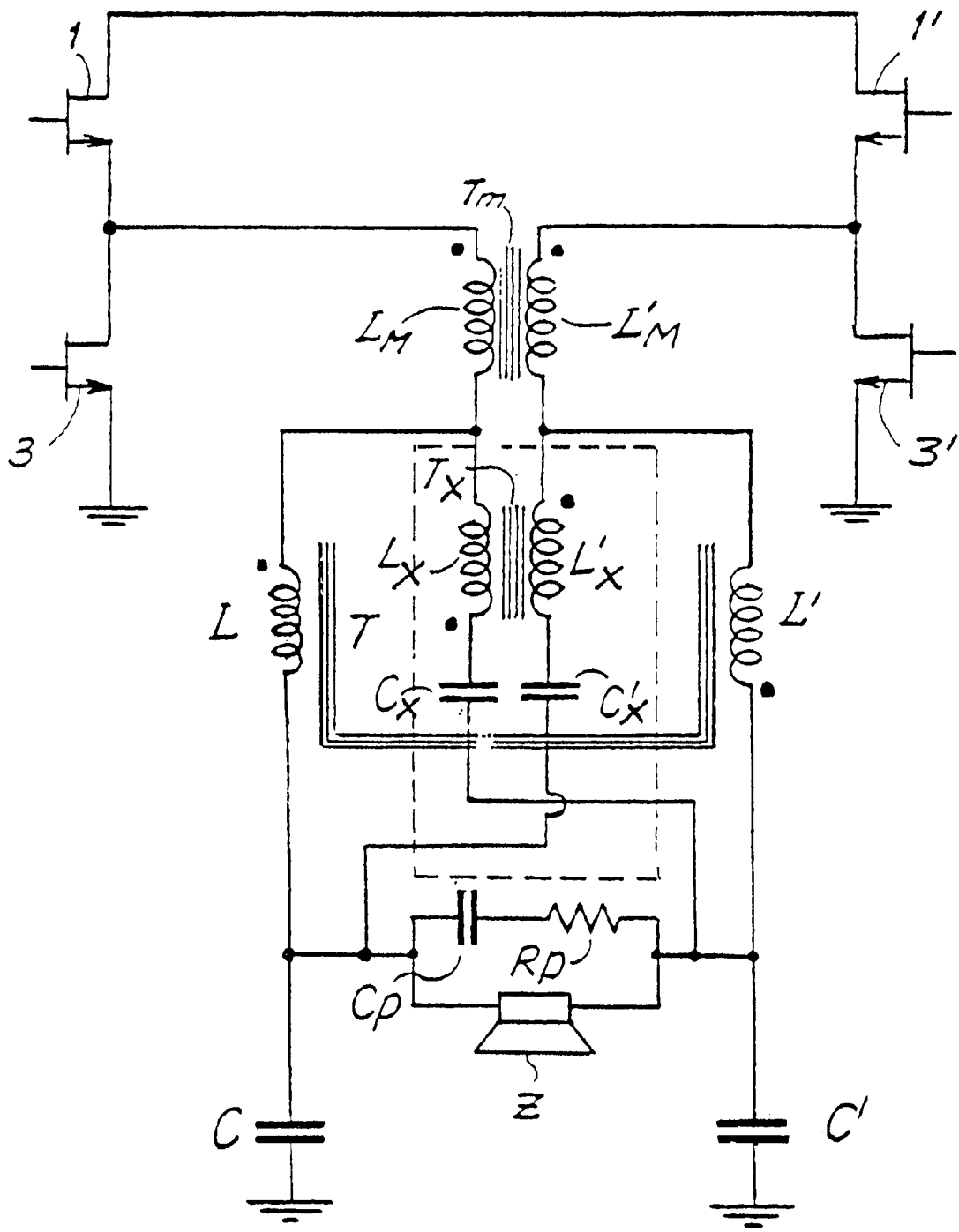

To meet the condition that the generators should be mirror images of each other, it is preferable to use a balanced configuration, or what is called a bridge configuration, which will be described with reference to FIGS. 4 to 6 and which constitutes the application of the inventive concept illustrated above to a conventional system of the type shown in FIG. 2.

In FIG. 4, the load is again indicated by Z and in parallel to it there is connected a serial RC circuit, consisting of the resistor Rp and the capacitor Cp, to prevent undamped resonances in the absence of the load Z. The load is connected as a bridge between two voltage generators, each consisting of a corresponding pair of driven switches, 1, 3 and 1', 3' respectively. The two pairs of switches 1, 3 and 1', 3' are driven by the same switching signal but in antiphase. This ensures an optimal symmetry in the two branches which can differ from each other only by the small tolerances between the driving devices and the power switches. These differences, as well as differences between the switching instants of the two pairs of switches, can easily be compensated for as will be indicated in the following text.

Between each pair of switches 1, 3 and 1', 3' and the corresponding terminals of the load there are connected two L-C networks, one comprising an inductance L and a capacitance C and the other comprising an inductance L' and a capacitance C'.

Figure 3:
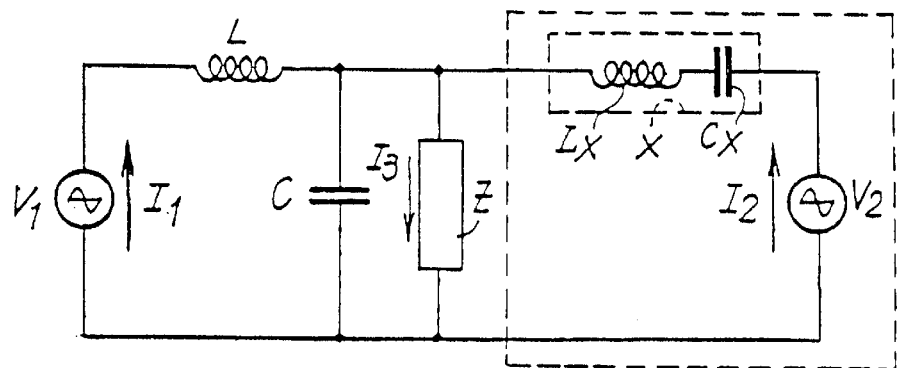
FIG. 3 is a block diagram of the system according to the invention.

In order to apply a switching residue cancellation signal to the terminals of the load Z, there is connected, in a similar way to that illustrated in FIG. 3, a first impedance between the first generator consisting of the driven switches 1, 3 and the opposite pole of the load Z, and a second impedance between the second generator consisting of the driven switches 1', 3' and the other pole of the load Z. Each of the two impedances consists of an inductance Lx and Lx' in series with a capacitance Cx and Cx' respectively. Where the principle of operation and the determination of the parameters Cx, Cx', Lx and Lx' are concerned, the disclosures relating to the case shown in FIG. 3 are applicable.

Figure 4:
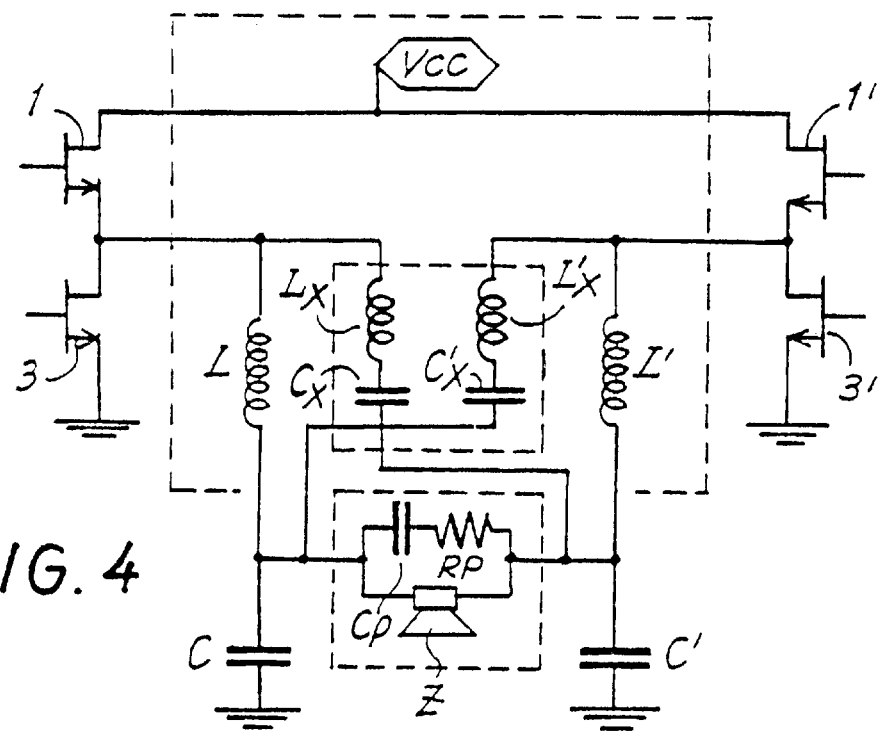
FIG. 4 shows a solution in a bridge configuration.

The system shown in FIG. 4 is balanced only in a theoretical way, whereas in the practical embodiment the tolerances on the individual components may include differences in the currents flowing in the two branches. In order to equalize the currents in the two branches, the two inductances L and L' can be coupled by winding them on a common magnetic core. In this case, the value of the overall inductance may be equal to the sum of the two individual inductances L and L'. A number of turnings which is smaller (by a factor of $2^{-1/2}$) than the total number of turnings to be used in the case of non-coupled inductances will therefore be used. This results in a reduction of the ohmic losses in the winding and a reduction in volume, in addition to an advantage in terms of current equalization.

The imperfect mirror image configuration of the real system may also be manifested in common-mode disturbances due to the switching residue. The common-mode cancellation is achieved by coupling the inductances Lx and Lx' by winding them on the same magnetic core. The same considerations are applicable in respect of the number of turnings, and consequently this coupling also permits a reduction of the number of turnings and therefore of the losses in the conductor and of the dimensions. The result is the circuit shown in FIG. 5, where identical or equivalent elements are indicated by the same reference numbers as those used in the diagram in FIG. 4. The symbol T indicates the winding core of the inductances L and L', and Tx indicates the winding core of the inductances Lx, Lx'.

Additionally, any difference between the switching instances of the two generators 1, 3 and 1', 3' can be considered as a phase difference and therefore as a common-mode disturbance in the output signal. This disturbance is eliminated with a common-mode filter which may consist of two coupled inductances as shown in the diagram in FIG. 6, where the common-mode filter consists of two inductances Lm and Lm', wound on the common core Tm. The remaining components are indicated by the same reference numbers as those used in the diagram in FIG. 5.

Particularly positive results are obtained by using:

for the common-mode inductor Lm, Lm', Tm: high-permeability toroidal cores, in order to have the maximum ratio between inductance and turnings, while minimizing the losses in the conductor (the core does not become saturated since there is no overall flow of a continuous or low-frequency current);

for the inductor L, L', T: low-permeability powdered iron toroidal cores which have very high values of inductance at the saturation, low AC losses at the switching frequency and excellent thermal stability. The use of the magnetic material must remain, in conditions of maximum current to the load, within rather restrictive limits of tolerance in the value of the inductance, to avoid imperfect cancellation of the "ripple". This condition is present in the materials indicated above;

for the inductor Lx, Lx', Tx: toroidal cores with characteristics similar to those described above, preferably identical in terms of homogeneity of the material and therefore with identical characteristics of the hysteresis cycle. It is preferable to have similar AC induction values (at the switching frequency $w_c$) in the cores Tx and T in order to optimize the characteristics of symmetry and cancellation. The core Tx is not subjected to high DC values (or those in the pass band) and therefore will have considerably smaller dimensions than the core T of the inductor L, L', T.

It is to be understood that the drawing shows only an example provided solely as a practical demonstration of the invention, and that this invention may be varied in its forms and dispositions without departure from the scope of the guiding principle of the invention. Any presence of reference numbers in the attached claims has the purpose of facilitating the reading of the claims with reference to the description and to the drawing, and does not limit the scope of protection represented by the claims.

What is claimed is:

1. A filter arrangement for eliminating a carrier signal from a modulating signal generated by a circuit supplying a load, the arrangement comprising:
   a first voltage generator generating a modulated signal with a carrier frequency;
   a low pass filter connected to said first voltage generator and including an inductor L and a capacitor C connectable to the load;
   A cancellation network with at least an inductor Lx and a capacitor Cx arranged in series, and a second voltage generator in antiphase with said first voltage generator, wherein said cancellation network is centered on said carrier frequency and subtracts from an output signal passing through said low pass filter a current equal to a residual carrier signal.

2. The filter as claimed in claim 1, characterized in that it is incorporated in an audio band amplifier.

3. The filter as claimed in claim 1, wherein: said second voltage generator supplies the load through an impedance formed from said inductance and capacitance is series in said cancellation network.

4. The filter as claimed in claim 1, characterized in that said inductor Lx and said capacitor Cx of the cancellation network and the inductor of said low pass filter L are correlated with each other and to the carrier frequency ($W_c$) by the relation:

$$W_c = 1/((Lx-L)Cx)^{1/2}.$$

5. The filter as claimed in claim 1, wherein: said first and second voltage generators form a balanced bridge structure with half bridges having a respective center, said half bridges forming said first and second voltage generators.

6. The filter as claimed in claim 5, wherein: the load includes first and second connecting poles connected to said first and second generators respectively, each said connecting pole of the load is associated with a separate said low pass filter including an inductor and capacitor, said cancellation network comprising first and second symmetrical branches with each having an inductor and a capacitor, said first symmetrical branch connecting said second voltage generator to the first pole of the load, said second symmetrical branch connecting said first voltage generator to the second pole of the load.

7. The filter circuit as claimed in claim 6, wherein:
   a value of said inductor and of said capacitor of each said branch of said cancellation network and the value of said inductor of each of said low pass filters are correlated to each other and to said carrier frequency (Wc) by the relation:

$$W_c = 1/((Lx-L)Cx)^{1/2},$$

wherein
   Lx is the value of the inductor of the cancellation network
   Cx is the value of the capacitor of the cancellation network
   L is the value of the inductor in the low pass filter.

8. The filter as claimed in claim 6, wherein: said inductances of the two low pass filters are coupled together and wound on a common core.

9. The filter as claimed in claim 6, wherein said inductors of the two branches of the cancellation network are coupled together and wound on a common core (Tx).

10. The filter as claimed in claim 9, further comprising: a common-mode filter between said first and second voltage generators and respective said low pass filters.

11. The filter as claimed in claim 10, wherein: said common-mode filter comprises two inductances wound on a common core.

12. A method for converting a signal, the method comprising the steps of:
    generating a modulated signal with a carrier signal at a carrier frequency;
    filtering said modulated signal to remove a portion of said carrier signal and create a filtered signal with a residual carrier frequency;
    generating a cancellation signal substantially in anti-phase with said modulated signal;
    filtering said cancellation signal to create a residual carrier cancellation signal substantially in anti-phase with said residual carrier frequency;
    combining said residual carrier cancellation signal with said filtered signal to reduce said residual carrier signal.

13. A method in accordance with claim 12, wherein:
    said filtering of said modulation signal applies a carrier impedance to said modulated signal at said carrier frequency;
    said filtering of said cancellation signal applies a cancellation impedance substantially equal to said carrier impedance to said cancellation signal at said carrier frequency.

14. A method in accordance with claim 13, wherein:

said generating of said modulated signal includes a modulating signal having a modulating frequency range;

said cancellation impedance is higher in said modulating frequency range than at said carrier frequency.

15. A method in accordance with claim 14, wherein:

said cancellation impedance is substantially infinite in said modulating frequency range.

16. A method in accordance with claim 13, wherein:

said generating of said modulated signal includes a modulating signal having a modulating frequency range;

said filtering of said cancellation signal is performed to have said residual cancellation signal be substantially one of an inverse, opposite or negative of said residual carrier signal with a minimum of other signals in said modulating frequency range.

17. A method in accordance with claim 12, wherein:

said combining creates a combined signal;

said combined signal is fed to a load.

18. A method in accordance with claim 17, wherein:

said generating of said modulated signal includes pulse width modulating said carrier signal;

said residual carrier signal has a frequency substantially equal to said carrier frequency;

said filtering is low pass filtering with an LC circuit;

said generating of said cancellation signal is performed to have said cancellation signal be substantially one of an inverse, opposite or negative of said modulated signal.

19. A method in accordance with claim 12, further comprising:

feeding said combined signal to one pole of a load;

filtering said cancellation signal substantially identically to said filtering of said modulated signal to create a counter balance filter signal;

filtering said modulated signal substantially similar to said filtering creating said residual carrier cancellation signal in order to create a counter balance residual cancellation signal;

combining and feeding said counter balance filter signal and said counter balance residual cancellation signal to another pole of the load.

20. A conversion circuit comprising:

a modulated signal generator generating a modulated signal with a carrier signal;

a carrier filter receiving said modulated signal and filtering out a portion of said carrier signal, said generating a filtered signal with a residual carrier signal;

a cancellation signal generator generating a cancellation signal in anti-phase with said modulated signal;

a residual cancellation filter receiving said cancellation signal and generating a residual carrier cancellation signal substantially in anti-phase with said residual carrier signal;

an output node receiving and combining said residual carrier cancellation signal with said filtered signal.

* * * * *